United States Patent [19]
Hudson

[11] Patent Number: 6,031,242
[45] Date of Patent: Feb. 29, 2000

[54] SEMICONDUCTOR DIE IN-FLIGHT REGISTRATION AND ORIENTATION METHOD AND APPARATUS

[75] Inventor: Edison T. Hudson, Chapel Hill, N.C.

[73] Assignee: Zevatech, Inc., Morrisville, N.C.

[21] Appl. No.: 09/012,776

[22] Filed: Jan. 23, 1998

[51] Int. Cl.[7] ............................ G01N 21/86; G01B 11/00
[52] U.S. Cl. ............................................. 250/548; 356/400
[58] Field of Search ................................... 355/72; 382/8, 382/145, 160, 141, 146; 356/375, 399, 400, 401; 414/787, 786; 29/407.1; 250/561, 548; 348/87, 95, 94

[56] References Cited

U.S. PATENT DOCUMENTS

| | | | |
|---|---|---|---|
| Re. 34,615 | 5/1994 | Freeman | 348/95 |
| 3,337,941 | 8/1967 | Drop | 29/203 |
| 3,804,270 | 4/1974 | Michaud et al. | 209/111.7 |
| 4,144,449 | 3/1979 | Funk et al. | 250/221 |
| 4,346,293 | 8/1982 | Fetzer | 250/222 R |
| 4,351,264 | 9/1982 | Flaum et al. | 118/203 |
| 4,378,134 | 3/1983 | Eddy | 308/3.5 |
| 4,383,359 | 5/1983 | Suzuki et al. | 29/712 |
| 4,584,047 | 4/1986 | Vanderpool et al. | 156/361 |

(List continued on next page.)

FOREIGN PATENT DOCUMENTS

| | | |
|---|---|---|
| 0 236 225 | 9/1987 | European Pat. Off. ........ H05K 13/02 |
| 0 340 100 | 11/1989 | European Pat. Off. ........ G06K 19/06 |
| 0 462 596 A1 | 12/1991 | European Pat. Off. ........ H01L 21/00 |
| 0 476 577 A2 | 3/1992 | European Pat. Off. ........ H05K 13/00 |
| 0 647 943 A1 | 4/1995 | European Pat. Off. ........ G11C 5/00 |
| 0 649 719 A1 | 4/1995 | European Pat. Off. ........ B29C 45/14 |
| 0 682 321 A2 | 11/1995 | European Pat. Off. ........ G06K 19/07 |
| 2 548 857 | 7/1983 | France ........................... H05K 3/00 |
| 28 34 836 | 8/1978 | Germany ....................... H05K 13/00 |
| 29 39 102 | 9/1979 | Germany ....................... B05C 01/08 |
| 34 24 323 A1 | 7/1984 | Germany ....................... H05K 13/02 |
| 35 44 221 A1 | 12/1985 | Germany ....................... H05K 13/04 |
| 37 36 563 A1 | 10/1987 | Germany ....................... H05K 13/02 |
| 41 27 696 A1 | 8/1991 | Germany ....................... H05K 13/02 |
| 2-303751 | 12/1990 | Japan ............................. B23Q 15/22 |
| 3-008655 | 1/1991 | Japan ............................. B65H 26/00 |
| 3-133763 | 6/1991 | Japan ............................. B65D 73/02 |
| 5-145283 | 6/1993 | Japan ............................. H05K 13/02 |
| 6-089910 | 3/1994 | Japan ............................. H01L 21/52 |
| 8-340175 | 12/1996 | Japan ............................. H05K 3/34 |
| 9-064094 | 3/1997 | Japan ............................. H01L 21/60 |
| 2 111 863 | 12/1981 | United Kingdom ............ B05B 13/00 |
| 2 183 820 | 6/1987 | United Kingdom ............ G05D 3/10 |

OTHER PUBLICATIONS

Gore, et al., Fluxing Tool Incorporated Into Part Feeder; Specifically for Assembly of C–5 Chip Carriers, Motorola Inc., Technical Developments, vol. 13, Jul. 1991, pp. 36–37.

*Primary Examiner*—David M. Gray
*Assistant Examiner*—Peter B. Kim
*Attorney, Agent, or Firm*—D'Alessandro & Ritchie

[57] ABSTRACT

The present invention provides for the accurate placement of an object having a surface pattern by relating the perimeter of the object to the surface pattern, such as a circuit pattern of a semiconductor die. This includes illuminating the object at its front and rear faces and viewing the object with a machine vision system. Front-side illumination of the surface pattern enables the machine vision system to obtain an image of the actual position of the circuit pattern or other pattern of interest on the front of the component. Rear illumination provides a silhouette of the perimeter edges of the component enabling the machine vision system to obtain the actual position of the perimeter edges of the component. A corrective offset from a normative feature location, such as the centroid defined by the perimeter edges of the component, is then calculated. The machine vision system is coupled to a conventional automatic component placement system that uses an in-flight perimeter registration and orientation system. The corrective offset from the machine vision system is used to adjust the position calculated by the conventional perimeter registration system to precisely place the component with respect to features of interest on the component, such as the center of the circuit pattern, rather than the mere outline of the component.

6 Claims, 7 Drawing Sheets

U.S. PATENT DOCUMENTS

| | | | |
|---|---|---|---|
| 4,610,083 | 9/1986 | Campisi et al. | 29/832 |
| 4,615,093 | 10/1986 | Tews et al. | 29/407 |
| 5,150,423 | 9/1992 | Hoki | 382/8 |
| 5,157,734 | 10/1992 | Chen et al. | 382/8 |
| 5,191,693 | 3/1993 | Umetsu | 29/429 |
| 5,195,234 | 3/1993 | Pine et al. | 29/720 |
| 5,213,653 | 5/1993 | Akahori et al. | 156/584 |
| 5,248,362 | 9/1993 | Sissons | 156/205 |
| 5,249,239 | 9/1993 | Kida | 382/8 |
| 5,275,657 | 1/1994 | Duffy et al. | 118/224 |
| 5,278,634 | 1/1994 | Skunes et al. | 356/400 |
| 5,289,625 | 3/1994 | Umetsu et al. | 29/426.3 |
| 5,309,223 | 5/1994 | Konicek et al. | 356/375 |
| 5,311,304 | 5/1994 | Monno | 348/87 |
| 5,380,099 | 1/1995 | Teramachi | 384/45 |
| 5,400,497 | 3/1995 | Watanabe et al. | 29/705 |
| 5,415,693 | 5/1995 | Yoneda et al. | 118/664 |
| 5,459,794 | 10/1995 | Ninomiya et al. | 382/145 |
| 5,475,919 | 12/1995 | Wu et al. | 29/841 |
| 5,488,771 | 2/1996 | Devitt et al. | 29/898.02 |
| 5,499,756 | 3/1996 | Banerji et al. | 228/214 |
| 5,515,600 | 5/1996 | Iwasaki et al. | 29/740 |
| 5,547,537 | 8/1996 | Reynolds et al. | 156/351 |
| 5,559,727 | 9/1996 | Deley et al. | 364/559 |
| 5,564,188 | 10/1996 | Akasako et al. | 29/898.03 |
| 5,592,562 | 1/1997 | Rooks | 382/150 |
| 5,650,081 | 7/1997 | Hudson | 219/229 |
| 5,669,970 | 9/1997 | Balog et al. | 118/213 |
| 5,708,419 | 1/1998 | Isaacson et al. | 340/572 |
| 5,715,594 | 2/1998 | Patterson et al. | 29/842 |
| 5,735,040 | 4/1998 | Ochi et al. | 29/841 |
| 5,788,379 | 8/1998 | Reeve | 384/41 |

SEMICONDUCTOR DIE IN-FLIGHT REGISTRATION AND ORIENTATION METHOD AND APPARATUS

BACKGROUND OF THE INVENTION

1. Field of the Invention

This invention is directed generally to the field of devices for robotically centering components having a surface pattern such as die substrates having a circuit pattern or ball grid array. More particularly, the present invention relates to a method and apparatus for providing offset information to a standard component in-flight registration and orientation system, thereby allowing the accurate placement of a surface pattern of the component for use with either standard "die-up" or flip-chip assembly methods.

2. Background Art

In electronic circuitry manufacturing, automatic placement machines for moving discrete electronic components or semiconductor die (components) from a source location to a target placement area are known in the art. For example, one commonly known type of automatic placement machine includes a mechanical transport such as a pick and place machine. It typically has a pick-up arm capable of movement in two or three dimensions and has a vacuum nozzle for providing a component pick up function. The pick and place machine is used to pick up discrete electronic components such as resistors, capacitors, integrated circuits and the like from a component supply source (e.g., component supply feeders, magazines, and component bins) and place the components on a printed circuit board or on a substrate, collectively known as workpieces. Examples of a typical workpiece include a semiconductor die that has a surface pattern or geometry, a printed circuit board that has electrically conductive traces, a plurality of pads to receive surface mounted components, or a ball grid array. The surface patterns have small dimensions which are getting smaller as the market demands greater component densities. Consequently, it is of importance that the position of each discrete component to be placed as well as the relative location of the workpiece be known to a degree of accuracy suited for such dimensions before placement.

A typical pick and place machine, however, suffers from component placement deviations due to various causes such as mechanical backlash and component movement during the pick-up process. Consequently, various methods and apparatuses have been devised to compensate or correct for such placement deviations.

Providing precise placement of a component using a pick and place system requires the ability to accurately determine the actual position of the component relative to a reference position before the placement of the component at a target placement area. A typical approach includes combining a pick and place machine with a device for measuring the actual position of the component relative to a reference location after the component is picked up but before placement at a target placement area. This approach relies on occluded topography such as the outer perimeter or external shape of a component.

A typical pick and place machine has a vacuum nozzle, known as a quill, that provides a grasping and pick-up function. While grasping the component but before placing the component at a target placement area, the pick and place machine determines the actual position of the component relative to the position of the quill (in-flight position). The in-flight position information is typically in the form of an X-Y coordinate relative to the position of the quill (X-Y deviation) and a theta value relative to a positioning axis such as the vertical, longitudinal axis of the quill. Note that since the quill is typically orthogonal to a grasping surface of the component such as a top surface, the theta value provides the angular deviation of the component relative to the axis of the quill.

By determining the actual position of the component relative to the position of the quill, i.e., the in-flight position of the component, the pick and place machine may determine whether the component is at a predetermined normative X-Y position and angular orientation ("expected position") and if not, compute a corrective offset that is used to correct any deviation of the component from the expected position while the pick and place machine is grasping the component but before placement of the component. By ensuring that the component is at the expected position before placement, precise and accurate placement at a target placement area may be achieved since the actual location of the component is known and may be modified to a predetermined in-flight position before placement.

One approach to obtaining the in-flight position of a component is described in U.S. Pat. No. 4,615,093 to Tews, et al. As seen in FIG. 1A, Tews picks up a component 110 with a pick and place machine 112 and brings the component 110 up to a position scanning station 114, which is mounted and carried with the pick up head of machine 112, so that the in-flight position of the component 110 may be obtained. Position scanning is carried out at any point between pick up and placement. The in-flight position includes the X-Y position of the component relative to a nominal position (the X-Y deviation) and an angular position relative to a positioning axis 116 (the rotational deviation). In FIG. 1B, the method of obtaining the in-flight position of a component 118 by scanning the external dimensions such as the perimeter edge 120 of the component 118 is shown. Specifically, scanning is achieved by using a light source such as a row 122 of individual beam emitting elements 124 or another source of light. Opposite to the light source is a row 126 of receiving elements 128 such as photo-diodes so that the shadow cast by the component 118 may be determined and its positioned determined thereby.

In FIG. 2 U.S. Pat. No. 5,278,634 to Skunes et al. refines the approach taken by Tews et al. by obtaining the in-flight position of a surface mount-type component 210 using a sensor system 212. The sensor system 212 is comprised of a light source 214 which is passed through a collimating lens 216 and then through an aperture 218 to create a wide beam or stripe of collimated light 220 which is focused past the body of the component 210 being aligned to strike a multi-element CCD sensory array 222. The sensor system 212 is mounted directly on the carrying mechanism for the surface mount component placement machine such as a pick and place machine. During transit of the component between the source of the component and the target placement area, the component is rotated forming a shadow on the detector array while the array is monitored. When the minimum width of the shadow is detected, the correct angular orientation is determined, the average of the edges of the shadow when compared with the center of the quill determines the coordinate (X, Y) location of the component on the quill. Two alignment operations normally occur, each displaced by 90 degrees. Thereafter, the sensor sends correcting signals to the component placement machine to assure the correct angular position and the correct X,Y position for the component to be placed at the target placement location by the component placement machine. Thus, Skunes et al. like Tews et al. relies on the external dimensions such as the perimeter edges of the component to produce the necessary shadows that are monitored by the sensor array.

U.S. Pat. No. 5,559,727 to Deley et al. discloses an approach that is very much like the approaches disclosed by Tews et. al. and Skunes et al. Deley et al. discloses combining a positioning sensing system with a mechanical transport which are mounted on a movable frame with each other. In FIG. 3, the position sensing system 310 includes projecting a wide beam of collimated light 312 on a component 314 whose position is to be determined. The unblocked rays of light 316 are received and processed by an intermediate series of lenses 318 and an aperture 320. The rays of light are then directed as an image onto a linear array sensor 322 having a plurality of high density pixel sensors whose position is known relative to the pick up tool. The component 314 whose position is to be determined is rotated in the imaging field. A computer/controller (not shown) is coupled to the linear array sensor and an encoder for producing sets of X, Y and theta data indicative of the refocused collimated light rays projected onto the linear array sensor 322 and the computer/controller is programmable for analyzing the digital data for determining the X, Y, and theta position of the component on the pick up tool. Deley et al. relies on the external dimensions or shape such as the perimeter edges of the component and/or component leads to produce a wave form representing the varying silhouette of the component when the component is rotated in front of the sensing system.

However, as will be described in more detail below, the above approaches to determining the in-flight position of the component are ill-suited for use with components that include semiconductor dies having high density surface patterns since they measure the external dimensions of the die, i.e., the perimeter edges rather than the position of the circuit pattern disposed on the die. Thus, any measured position obtained reflects the actual position of the die not the surface pattern disposed thereon.

As generally known, the use of semiconductor die with either die up or flip-chip assembly methods includes removing die having a surface geometry or pattern such as a circuit pattern from a source location and placing the die to a new location for subsequent assembly. Since semiconductor die as well as other types of small components having lithographic or printed patterns are typically produced in an arrayed manner on a wafer, removal of each die from the wafer includes the sawing or dicing of the wafer, thereby producing individual component die as known in the art. Once the sawing or dicing process has been completed, placement of each die typically includes using a mechanical transport such as the types described above to place each die at a new location for subsequent assembly.

Placement of the die is critical since any subsequent assembly to be done to the die requires knowledge of the actual position, i.e., the X-Y position and angular orientation, of the circuit pattern on the die. For example, a subsequent assembly after dicing may include wire bonding the interconnects located within the circuit pattern. A process that inherently requires knowledge of the actual position of the circuit pattern in order to obtain the precise location of the interconnects requiring wire bonding.

As disclosed by Tews et al., Skunes et al., and Deley et al., the actual position of the component is calculated by measuring the external features of the component that provide an occluded topography such as the leads or package body of a discrete component. The same approach may be used for semiconductor die where the occluded topography used is the perimeter edges of the die. The perimeter edges of the die are used to obtain the actual position of the die. The actual position of the die is used in turn to calculate the X-Y position and angular orientation ("extrapolated position") of the circuit pattern using the centroid, i.e., mean center, of the circuit pattern as a point of reference. The extrapolated position of the centroid of the circuit pattern is not measured but assumed to be at a constant offset from the actual position of the perimeter edges of the die.

However, relying on the perimeter edges of a die to extrapolate the position of the circuit pattern is not well-suited to semiconductor die having very high surface pattern densities. Such densities leave very little room for variances between the actual location of the die pattern and the perimeter edges of the die. Specifically, although the pattern on the surface of a die is highly accurate and may be ensured to vary less than 0.5 microns as currently known in the art, the perimeter edges are less accurate and vary up to 25 microns.

The position of the perimeter of semiconductor die varies from die to die because typically more than one die are produced from a single silicon wafer and must each be sawed to produce an individual die. But the dicing or sawing process has a limited best accuracy of being greater than 25 microns. Due to factors such as the wearing of the dicing saw and set-up inaccuracies, the sawed edges comprising the perimeter of each die are typically off-center and vary relative to the centroid of the circuit pattern on the surface of the die. As die features become smaller and denser in new semiconductor designs, the accuracy needed in automatic assembly systems has increased.

Consequently, using the perimeter of the die as an accurate and consistent reference to the centroid position and orientation of the die surface pattern is ill-suited for placement purposes for such dies.

Also, another approach as known in the art is to measure the circuit pattern rather than using the perimeter edge of the die prior to picking up the die with a mechanical transport such as a pick and place system. However, placement is carried out "blind" and without regard to any errors introduced by the mechanics of picking-up the die ("pick-up errors"). These pick-up errors affect placement accuracy of the circuit pattern disposed on the die and must be compensated for in a later step of the assembly process such as through wire-bonder offset correction.

SUMMARY OF THE INVENTION

The present invention provides for the accurate placement of an object having a surface pattern by relating the perimeter of the object to the surface pattern, such as a circuit pattern of a semiconductor die. This includes illuminating the object at its front and rear faces and viewing the object with a machine vision system. Front-side illumination of the surface pattern enables the machine vision system to obtain an image of the actual position of the circuit pattern or other pattern of interest on the front of the component. Rear illumination provides a silhouette of the perimeter edges of the component enabling the machine vision system to obtain the actual position of the perimeter edges of the component. A corrective offset from a normative feature location, such as the centroid defined by the perimeter edges of the component, is then calculated. The machine vision system is coupled to a conventional automatic component placement system that uses an in-flight perimeter registration and orientation system. The corrective offset from the machine vision system is used to adjust the position calculated by the conventional perimeter registration system to precisely place the component with respect to features of interest on the component, such as a selected group of contact pads or interconnect features found in a semiconductor circuit pattern, rather than with respect to the mere outline of the component.

OBJECTS AND ADVANTAGES OF THE INVENTION

Accordingly, it is an object and advantage of the present invention to provide an improved automatic placement machine for and method for placement of components having a surface pattern disposed thereon.

More particularly, it is an object and advantage of the present invention to enable an automatic placement machine to determine the X-Y position and angular orientation of the surface pattern (such as the interconnect features or contact pads of a circuit pattern) disposed on the die relative to the perimeter of the die and to combine this information with a second measurement of the die centroid using the perimeter of the die in order to produce an exact correction factor before placement.

Furthermore, it is an object and advantage of the present invention to extend the concept of measuring a component to be picked and placed by machine to uses that are specific to the assembly of semiconductor dies using either standard "die-up" or flip-chip methods.

These and many other objects and advantages of the present invention will become apparent to those of ordinary skill in the art from a consideration of the drawings and ensuing description of the invention.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Figure 1A:
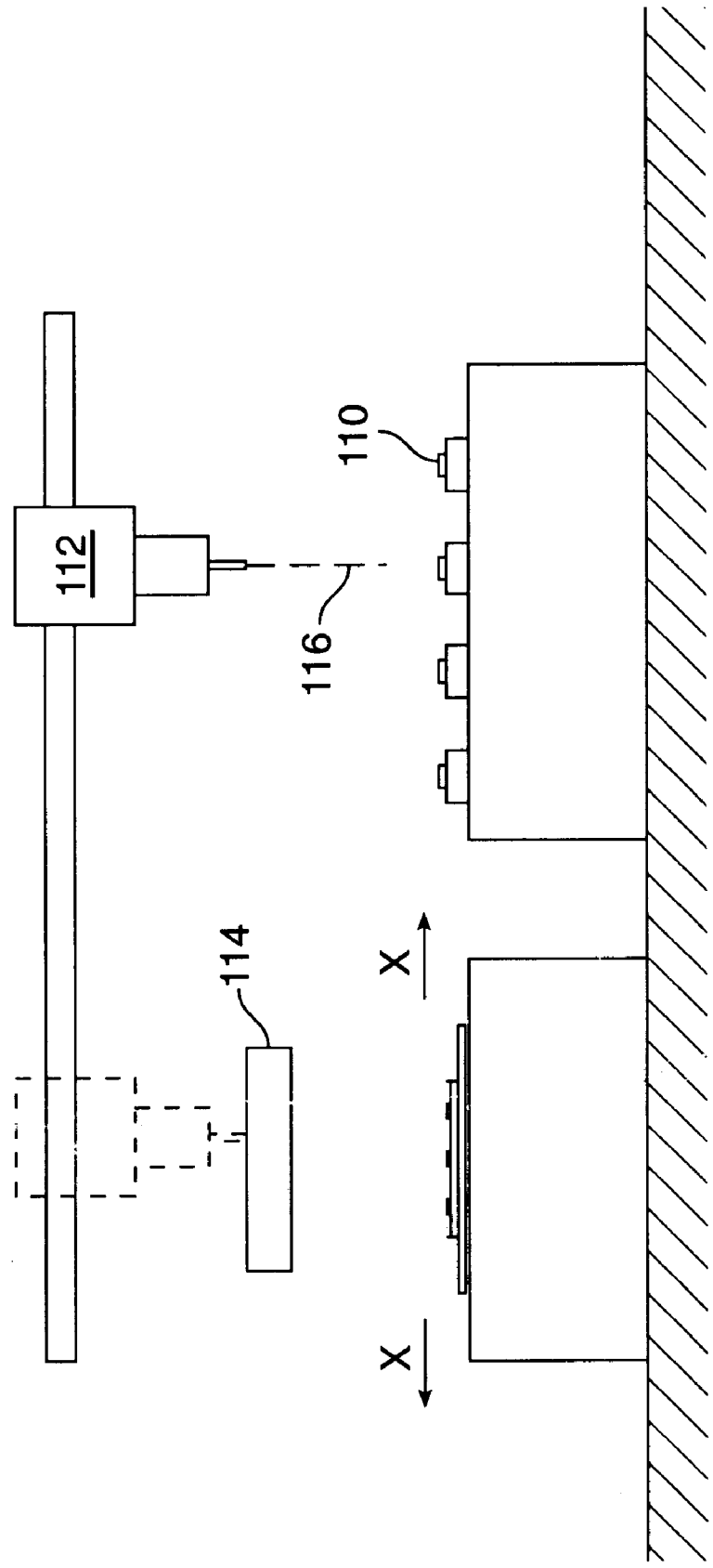
FIG. 1A is a side view schematic drawing showing a prior art pick and place machine having a position scanning station between the source location and the target placement location.
Figure 1B:
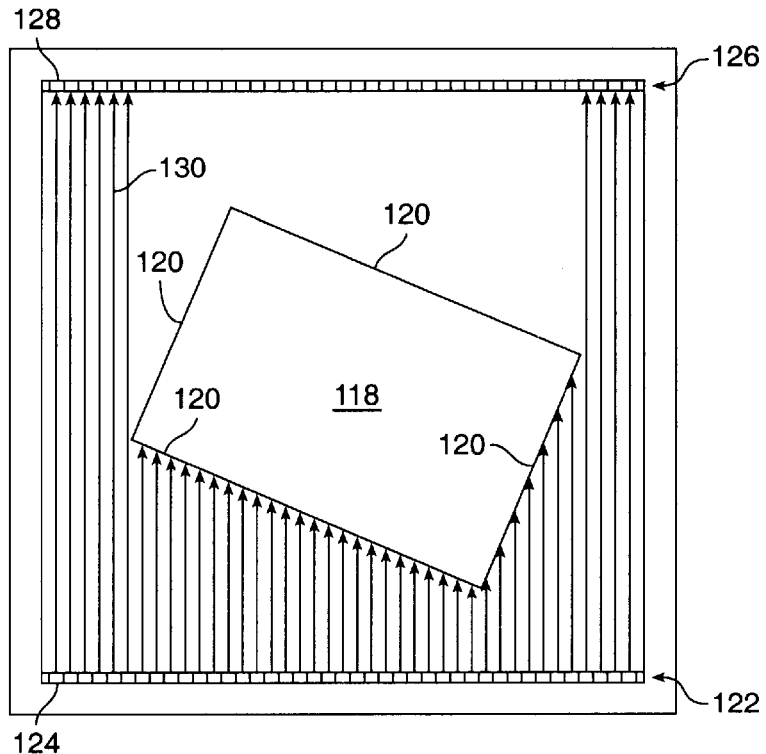
FIG. 1B is a schematic drawing showing the position scanning station described in FIG. 1A. The scanning station employs a light source and a plurality of sensors.
Figure 2:
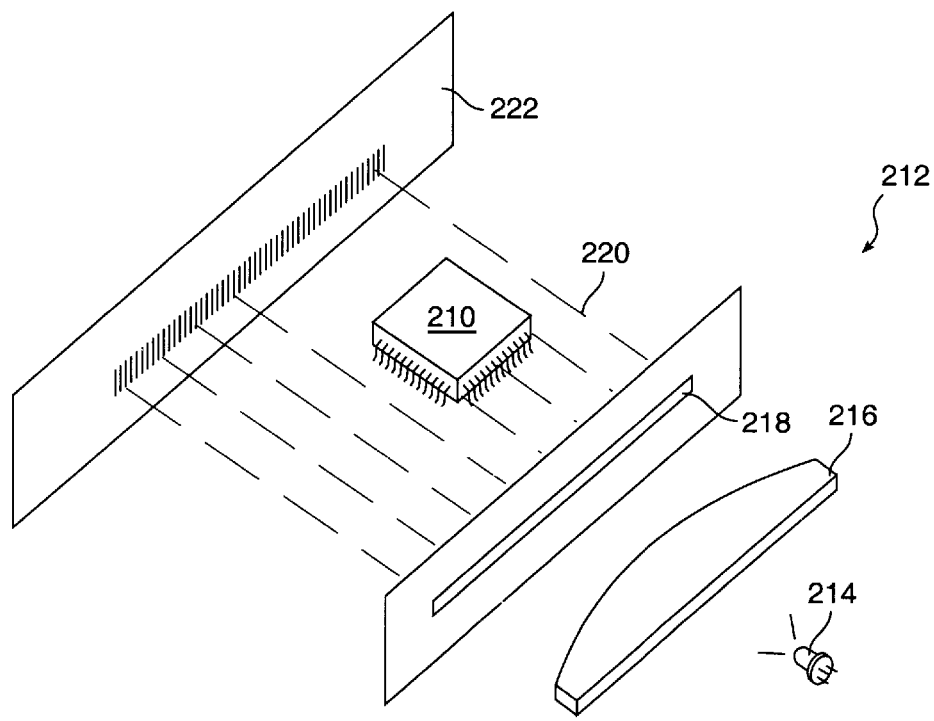
FIG. 2 is a schematic drawing showing the elements of another prior art scanning station employing a light source and a plurality of sensors.
Figure 3:
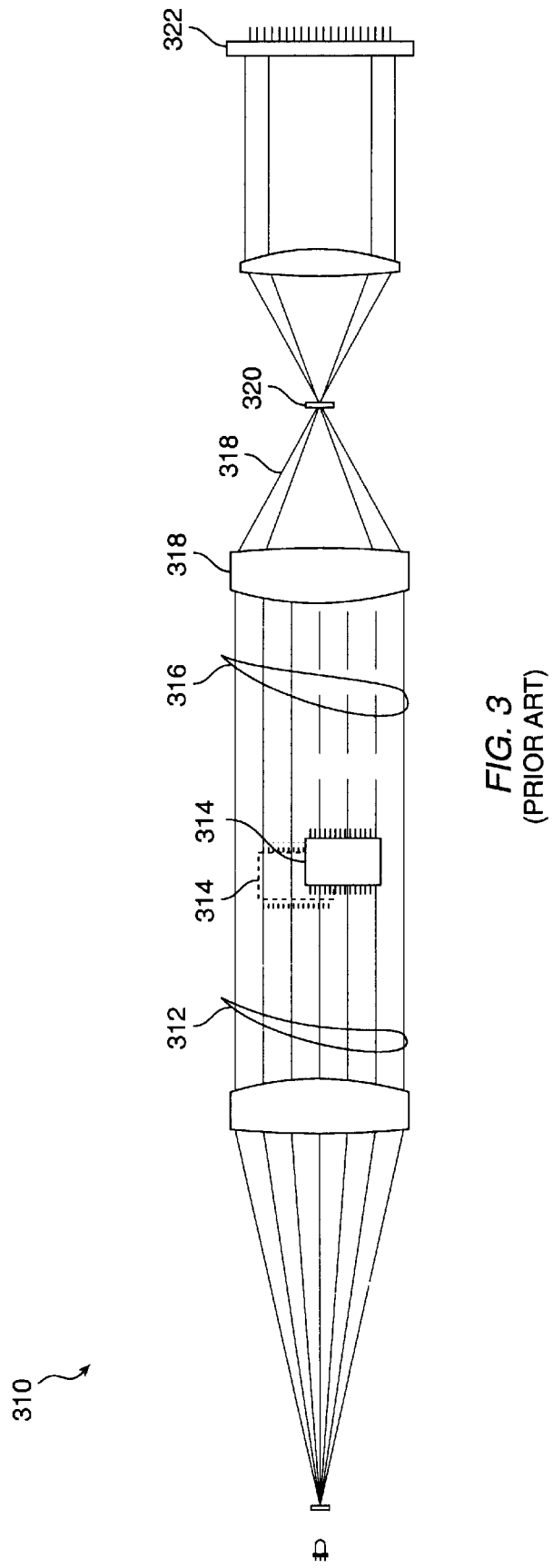
FIG. 3 is a schematic drawing showing another sensing system that projects a beam of light directed at a component and received by a linear sensor array.
Figure 4A:
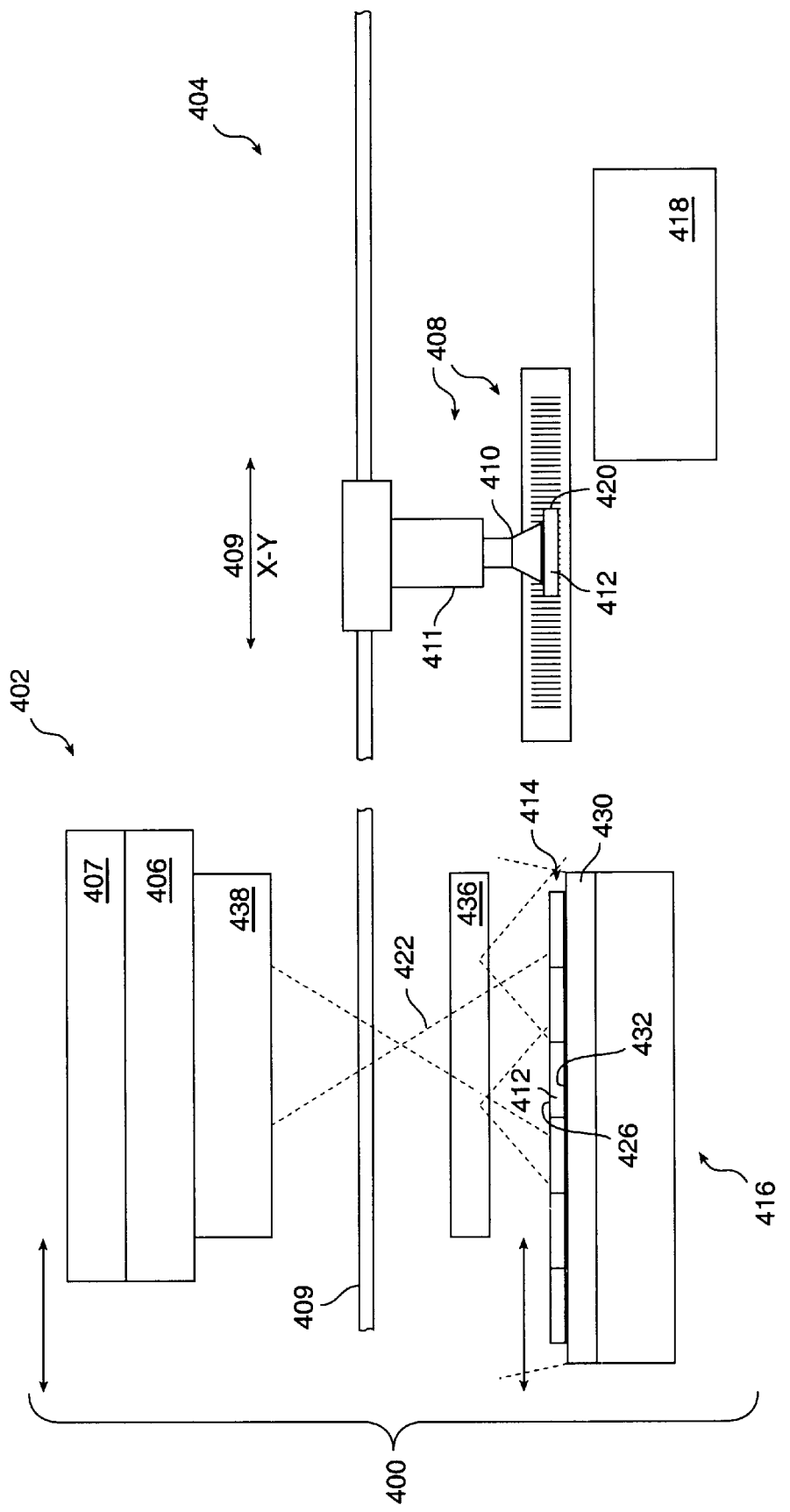
FIG. 4A is a side view schematic drawing of a presently preferred embodiment of the present invention integrated with an automatic placement machine that uses a conventional in-flight perimeter registration system.
Figure 4B:
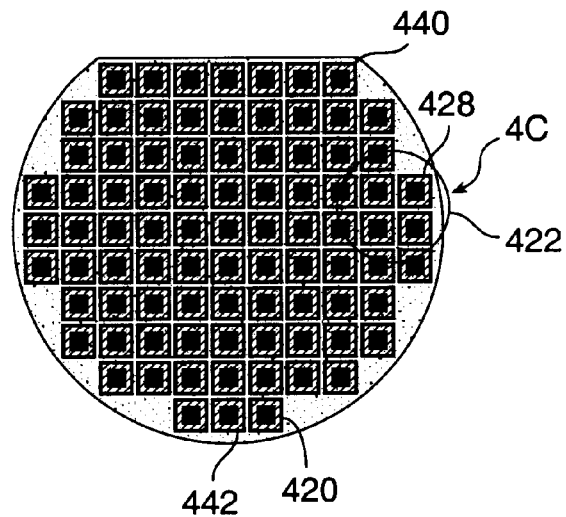
FIG. 4B is a diagram of the typical field of view as seen from a scanner according to a presently preferred embodiment of the present invention showing die channels as light-colored areas demarcating semiconductor die as a result of back lighting or illumination.
Figure 4C:
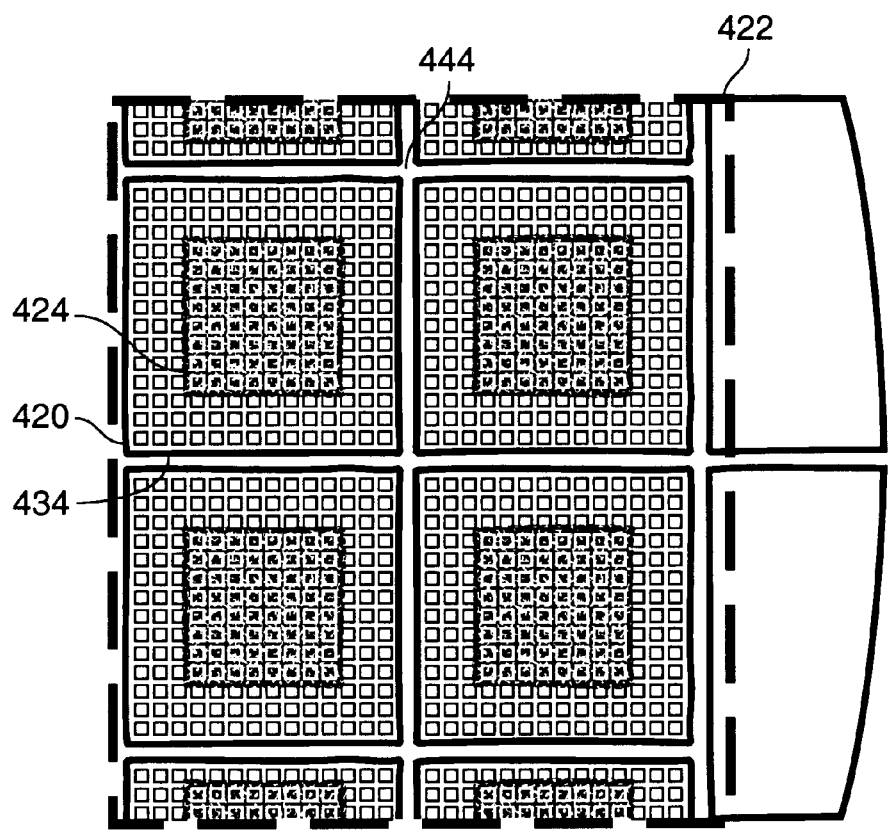
FIG. 4C is a diagram of the typical field of view as seen from a scanner that also shows the saw cuts imaged as light areas as a result of back lighting or illumination.

Turning now to FIG. 4A, an automatic placement machine 400 using the present invention is depicted. The apparatus of the present invention provides a machine vision system 402 that is integrated with a conventional automatic component placement system 404 that uses an in-flight perimeter registration and orientation system 408. In-flight perimeter registration and orientation system 408 is any type of placement system that is capable of placing a die 412 at a placement location by determining the centroid of the perimeter edge 420 (see FIGS. 4B–4C) through the measurement of occluded topography. One such in-flight registration and orientation system is available from CyberOptics of Minneapolis, Minn. Machine vision system 402 includes an area array sensor 406, or equivalent sensing system, such as a charge-coupled device ("CCD") imager, or any other equivalent device; and a control system 407 for generating a correction factor and for directing the components of machine vision system 402, as described.

Control system 407 generates the correction factor by using front illumination and imaging to obtain a surface geometry, such as the die pattern of a semiconductor die contact pads, or other interconnect features, of the object being illuminated. Control system 407 also uses back illumination of the die to determine the location and orientation of the edges of die 412 so that a die pattern to edge relationship can be calculated. Control system 407 uses the correction factor to finely adjust the die position that was calculated by in-flight registration and centering system 408 for die 412. This results in the final position of the object to be based on the surface pattern of the object.

A mechanical transport 408 such as a pick and place machine moveable in an X-Y plane 409 and a pick-up head 410 is shown. The pick-up head 410 is used for grasping and moving die 412 from a source location 414, such as from a diced silicon wafer 414 or from a strip of nitto tape having attached die, located at a supply location 416 to a placement location 418. Accurate and precision placement of die 412 at placement location 418 is based on the centroid of die 412 being corrected with the correction factor provided by control system 407 to in-flight registration and orientation system 408. Thus, the correction factor from the machine vision system is used to adjust the position calculated by the conventional perimeter registration system to precisely place the component with respect to features of interest on the component, such as the center of the circuit pattern or center of a group of selected contact pads, rather than the mere outline of the component.

The area array sensor 406 is positioned over a diced silicon wafer 414 and focused so as to have a field of view 422 that includes at least one component having a surface geometry, such as circuit pattern 424 disposed on a top surface 426 of a selected semiconductor die 428. Note that as presently contemplated, the present invention is not intended to be limited in any way for use solely with semiconductor die cut from a wafer but may be used with any component having a surface pattern such as a ball grid array or microprocessor.

A back lighting system 430 integrated with the machine vision system 402 is provided for illuminating the bottom surface 432 of the die 412, producing an image of a perimeter silhouette 434 of the die 412. A front lighting system 436 is provided for illuminating the top surface 426 of the die 428. The appropriate illumination level and configuration for the illumination is determined by the optics assembly 438 and the area array sensor 406 being employed.

As commonly known, a processed uncut wafer 440 typically has lattice-like channels or "streets" 442 that run in rows and columns demarcating the perimeter edge 420 of individual die formed on the uncut wafer 440. The streets 442 are typically "cut-out" or removed during the dicing process, resulting in voids 444 formed between each perimeter edge 420 of the selected die 428. The voids 444 enable the back light system 430 to produce an image of the perimeter silhouette 434 from the selected die 428 as illuminated by the back light system 430. Note that before dicing, each processed uncut wafer 440 has a clear tape backing commonly known as Nitto tape (not shown). The Nitto tape is not cut during the dicing process since the tape stretches away from the cutting blade (not shown). This enables the streets 442 to be removed and the voids 444 formed while the selected die 428 are kept at their respective positions after dicing.

The maximum number of die 428 captured within a chosen field of view 422 is constrained by the placement accuracy required, the maximum resolution of the optics assembly 438 for a given field of view 422, and the number of selected die 428 that can fit within the field of view 422. More particularly, the number of selected die 428 that can be captured at one time by the area array sensor 406 depends on the size of the field of view 422 chosen. The larger the field of view 422, the greater number of selected die 428 that may be imaged. However, the size of the field of view 422 is inversely proportional to the spatial distortion or "pixel resolution" for a given optics assembly, i.e., an increase in the field of view results in a decrease in pixel resolution. In turn, the minimum pixel resolution allowable is limited by the required placement accuracy. Consequently, the placement accuracy required determines the minimum pixel resolution allowable which in turn determines the maximum field of view 422.

For example, it is contemplated that a placement accuracy of 50 microns requires a deviation of no more than 10%, i.e., 5 microns. To accurately measure a deviation of 5 microns requires a minimum pixel resolution of about 1 micron or 20% of the maximum allowable deviation from the required placement accuracy. Obtaining a minimum pixel resolution results in a corresponding field of view which in turn determines the maximum number of die of any given size that may fit within the field of view chosen. For example, a 20 mm×20 mm field of view will be sufficient to cover one 16 mm×16 mm die, four 8 mm×8 mm dice, or sixteen 4 mm×4 mm dice. Thus, the maximum number of die that may fit within the field of view chosen while optimizing accuracy is dependent on choosing a field of view that does not exceed the minimum pixel resolution required for a given placement accuracy requirement.

Figure 5:
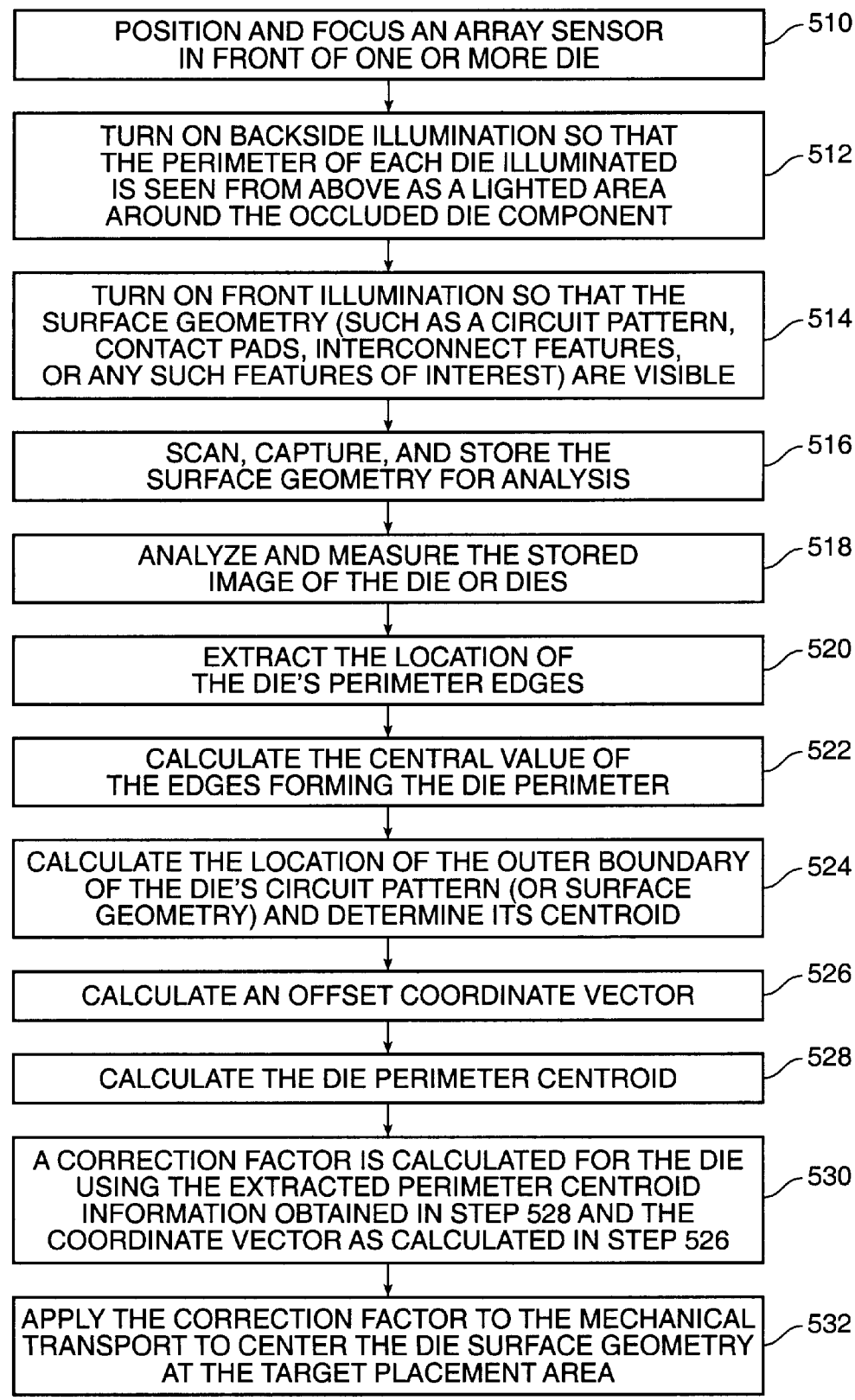
FIG. 5 shows a flowchart for a method of in-flight centering according to a presently preferred embodiment of the present invention.

FIG. 5 shows a flowchart for the preferred method of in-flight centering.

Note that steps 510 through 532 may be performed or directed by control system 407 which may be provided by using an embedded system, or equivalent means, running under program control.

At step 510, under direction of control system 407, the area array sensor 406 is positioned and focused above one or more selected semiconductor die 428.

At step 512, the back lighting system 430 illuminates the bottom surface 432 of a silicon wafer 414, producing an image of the die's perimeter silhouette 434.

At step 514, the front lighting system 436 illuminates the top surface 426 of the wafer 414 so as to illuminate at least one circuit pattern (or surface geometry) 424 disposed on a corresponding selected die 428. The appropriate illumination level and configuration for the illumination is determined by the optics 438 and the area array sensor 406 being employed.

At step 516, an image of at least one selected die 428 is scanned, captured, and stored for digital analysis. The captured image is digitized for intensity graduations, grayscale or any other spectral property related to the pattern or geometric features that were captured. This obtains an image of the surface geometry, such as a die circuit pattern, interconnect features, contact pads, and the like, which is stored as a digital scale.

At step 518, the stored information is analyzed and measured using techniques known in the art such as grayscale edge extraction using gradient or gaussian calculations, or techniques such as normalized correlation.

Figure 6:
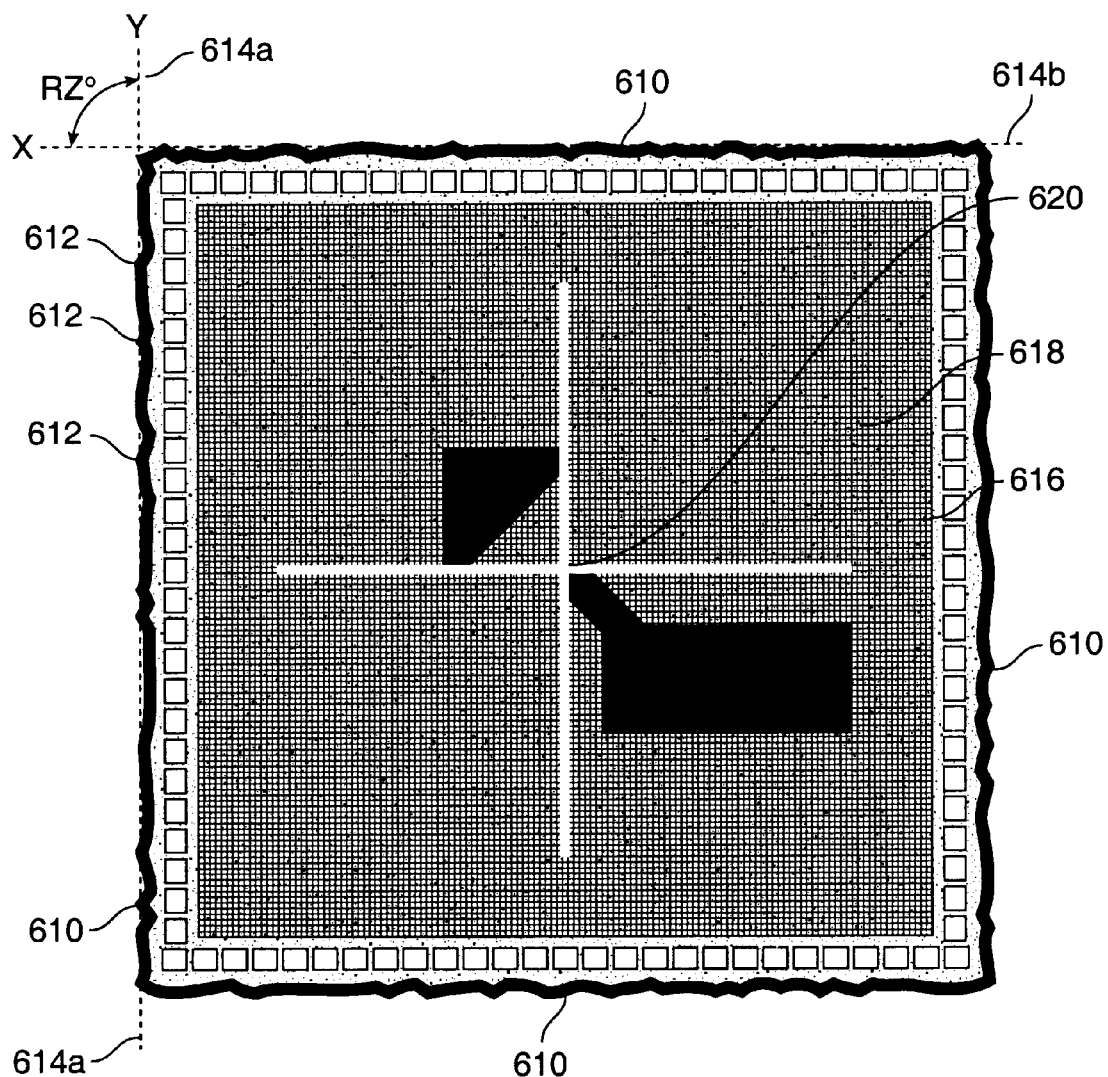
FIG. 6 is a schematic diagram of a semiconductor die with two fitted lines X,Y that are each applied to an irregular perimeter edge to forming an intersection.

At step 520, the location of the die's perimeter edges 610 are extracted, as shown in FIG. 6. Each perimeter edge 610 suffers from irregularities that are defined by edge points 612 so that the central value of the edge points is used to determine the location of each edge 610. Specifically, the location of the die's irregular perimeter edge 610 is made visible by the back light 430, scanned, and then extracted by finding the central value 614a of edge points 612 comprising each one of the irregular edges forming the perimeter edges 610 of the die.

At step 522, the central value 614a of the irregular edges 610 forming the die perimeter is then calculated by using the location of the perimeter edges 610 with any appropriate method known in the art, such as a fitting method. In the preferred embodiment of the present invention such a solution includes using a linear least squares fitting technique to obtain the orientation and location of the central value 614a representing each edge. The central value for each edge is expressed in polar coordinates, thereby providing the location and orientation of the die edge. This is the first geometric parameter extracted, and is hereinafter referred to as fit lines.

At step 524, the location 616 of the outer boundary of the surface geometry 618 located on the die surface, such as the outer most pathways, contact pads, or the interconnect features of a circuit pattern on a semiconductor die, is calculated using the image information captured in step 516. The centroid location 620 of the surface geometry 618 is then calculated and expressed in polar coordinates. This is the second geometric parameter extracted.

At step 526, an offset coordinate vector is calculated using the geometric parameters extracted in steps 522 and 524 and is expressed in polar coordinates as X, Y, and RZ. In the preferred embodiment of the present invention, this calculation is the vector sum of the X, Y, and RZ components of at least two linear least squares fit lines of the irregular perimeter edge, as extracted in step 522, and the centroid location 620 of the surface geometry 618, as extracted in step 524. The offset coordinate vector specifies the relationship between at least two fitted lines 614a, 614b with the centroid location 620 of the surface geometry 618 as seen from a selected field of view.

At step 528, the die 412 to be assembled is selected and the pick-up head 410 is moved into position to pick-up the die 412 at a somewhat central location of the die 412. The die 412 is then picked up and moved along an X, Y plane toward the placement location 418. During transition from the supply location 416 to the placement location 418, the perimeter centroid location of the die 412 is determined relative to the coordinate system of the pick and place mechanism, as known in the art. As discussed above, the perimeter centroid location of the die is determined using an in-flight registration and centering system that scans the perimeter of the die to obtain the location and orientation of the die's perimeter. It then uses the location and orientation of the die's perimeter to approximate the location of the die's centroid using the scanned perimeter edge.

At step 530, a correction factor is then calculated for the die using the extracted perimeter centroid location obtained in step 528 and the coordinate vector as calculated in step 526.

At step 532, the correction factor is then provided to the in-flight perimeter imaging and registration system 404 to center the die surface geometry 618 at the placement location 418. Adjustment of the placement location 418 is thus accomplished by offsetting the perimeter centroid location of the die found by the in-flight registration and centering system.

The above method enables placement of the die at the placement location 418 such that the circuit pattern, contact pads, interconnect features, or the like, are located and oriented correctly at the placement location 418 regardless of the irregularity of the peripheral sawed edges of the die and the mechanical disturbance introduced by the picking operation. Overall assembly accuracy is enhanced and the production cycle is optimized by having this centering occur during translation from the supply location 416 and to the intended placement location 418. Such an advantage can easily be obtained in areas specific to the assembly of semiconductor dies that use either standard "die-up" or flip-chip methods because such methods require a high degree of precision with respect to the location of contact pads and interconnect features.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An apparatus for placing a component with a surface pattern at a placement location, comprising:

a sensing system for sensing an image of a surface of the component and for generating first data representing a position of the surface pattern relative to a plurality of perimeter edges of the component;

a pick and place system for moving the component from a source location to the placement location;

a perimeter imaging and registration system for determining second data representing a location of said plurality of perimeter edges of the component relative to a coordinate system of said pick and place system during the transport of the component from said source location to the placement location; and a control system for placing the component at the placement location using said first data and said second data.

2. The apparatus of claim 1, wherein said sensing system includes a back lighting system for illuminating a bottom surface of the component, producing a silhouette image of said plurality of perimeter edges of the component, and a top lighting system for illuminating the surface pattern of the component.

3. A method for placing a component with a surface pattern at a placement location, comprising the steps of:

sensing an image of a surface of the component and generating first data representing a position of the surface pattern relative to a plurality of perimeter edges of the component;

picking the component by a pick and place system and moving it to the placement location while scanning said plurality of perimeter edges of the component and determining second data representing a location of said plurality of perimeter edges of the component relative to a coordinate system of said pick and place system; and placing the component at the placement location using said first and second data.

4. The method of claim 3, wherein sensing includes illuminating a bottom surface of the component, producing a silhouette image of said plurality of perimeter edges of the component, and illuminating the surface pattern of the component.

5. A method in accordance with claim 3, wherein placing the component comprises:

calculating said position of the surface pattern relative to said coordinate system of said pick and place system; and moving the component to the placement location based on said position of the surface pattern.

6. An apparatus in accordance with claim 1, wherein:

said control system calculates a correction factor for adjusting the placement location.

* * * * *

UNITED STATES PATENT AND TRADEMARK OFFICE
CERTIFICATE OF CORRECTION

PATENT NO. : 6,031,242
DATED : February 29, 2000
INVENTOR(S) : Edison Hudson

It is certified that error appears in the above-identified patent and that said Letters Patent is hereby corrected as shown below:

On column 6, line 39, please replace "A mechanical transport 408" with -- A mechanical transport 411--.

On column 8, line 59, please replace "linear least squares fit lines of" with --linear least squares fit lines to--.

Signed and Sealed this

Twenty-seventh Day of March, 2001

*Attest:*

NICHOLAS P. GODICI

*Attesting Officer*

Acting Director of the United States Patent and Trademark Office